(12) United States Patent
Tanaka (10) Patent No.: US 8,026,577 B2
(45) Date of Patent: Sep. 27, 2011

(54) SEMICONDUCTOR APPARATUS HAVING A TRIPLE WELL STRUCTURE AND MANFACTURING METHOD THEREOF

(75) Inventor: Takuji Tanaka, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 132 days.

(21) Appl. No.: 12/068,914

(22) Filed: Feb. 13, 2008

(65) Prior Publication Data

US 2008/0150032 A1 Jun. 26, 2008

Related U.S. Application Data

(63) Continuation of application No. PCT/JP2005/015072, filed on Aug. 18, 2005.

(51) Int. Cl.
*H01L 29/40* (2006.01)
*H01L 21/44* (2006.01)
(52) U.S. Cl. ........... 257/621; 257/E29.119; 438/667
(58) Field of Classification Search .......... 438/224, 438/228, 667; 257/621, E29.119
See application file for complete search history.

(56) References Cited

U.S. PATENT DOCUMENTS

| | | | | |
|---|---|---|---|---|
| 6,150,699 A | * | 11/2000 | Wakabayashi | 257/378 |
| 6,211,003 B1 | * | 4/2001 | Taniguchi et al. | 438/228 |
| 6,500,705 B2 | * | 12/2002 | Kumagai | 438/223 |
| 7,075,169 B2 | * | 7/2006 | Minami et al. | 257/622 |
| 7,282,771 B2 | * | 10/2007 | Voldman | 257/372 |
| 2003/0168712 A1 | | 9/2003 | Shin et al. | |
| 2005/0098835 A1 | | 5/2005 | Ushiroda et al. | |
| 2005/0233541 A1 | | 10/2005 | Shin et al. | |
| 2007/0228481 A1 | * | 10/2007 | Tanaka | 257/369 |

FOREIGN PATENT DOCUMENTS

| | | |
|---|---|---|
| JP | 5-267606 A | 10/1993 |
| JP | 10-199993 A | 7/1998 |
| JP | 2003-282822 A | 10/2003 |
| JP | 2005-142321 A | 6/2005 |

OTHER PUBLICATIONS

International Search Report of PCT/JP2005/015072, date of mailing Nov. 22, 2005.
Chinese Office Action dated May 22, 2009 issued in corresponding Chinese patent Application No. 2005800513355.
Republic of Korea Office Action dated Sep. 24, 2009 issued in corresponding Korean patent Application No. 10-2008-7004146 (w/Partial English Translation).

* cited by examiner

*Primary Examiner* — William D Coleman
(74) *Attorney, Agent, or Firm* — Westerman, Hattori, Daniels & Adrian, LLP (57) ABSTRACT

A semiconductor apparatus according to the present invention includes a first well-region and a second well-region in a semiconductor substrate, and a plurality of transistors formed to the second well-region. Further, the semiconductor apparatus includes a through-hole region that is formed so as to pierce through the first well-region and enables the second well-region to be electrically conductive to the semiconductor substrate on the bottom of the second well. Furthermore, in the semiconductor apparatus, the border of the through-hole region is arranged between the transistors, and is also arranged to be planarity apart from the transistor.

5 Claims, 9 Drawing Sheets

SEMICONDUCTOR APPARATUS HAVING A TRIPLE WELL STRUCTURE AND MANFACTURING METHOD THEREOF

BACKGROUND OF THE INVENTION

1. Field of the Invention

The present invention relates to a semiconductor apparatus having a transistor and a manufacturing method thereof. In particular, the present invention relates to a semiconductor apparatus that stabilizes characteristics of a transistor in a triple well of the semiconductor apparatus having a triple-well structure and a manufacturing method thereof.

2. Description of the Related Art

In order to realize the design of low consumption power of an LSI (Large Scale Integration) circuit, a CMOS circuit is generally used as the LSI circuit. The CMOS circuit comprises a P-channel MOS (PMOS) transistor and an N-channel MOS (NMOS) transistor. The PMOS transistor is arranged to an N-type well (N-well) region, and the NMOS transistor is arranged to a P-type well (P-well) region.

For a semiconductor apparatus in which noises to the P-well region need to be suppressed from a semiconductor substrate except for the P-well region and a semiconductor apparatus in which the injection of current of minority carrier on a semiconductor substrate except for the P-well region to the P-well region needs to be suppressed, a triple-well structure is used for surrounding the circumference of the P-well region in a P-type semiconductor substrate with the N-well region.

Because the N-well region surrounding the circumference of the P-well region functions as electrical insulation of the P-type substrate and the P-well region so as to suppress the noises from the semiconductor substrate and prevent the injection of current of minority carrier in the semiconductor substrate.

The above-mentioned semiconductor apparatus includes, e.g., a semiconductor apparatus concerned with a memory and a semiconductor apparatus that uses a plurality of signals at different logical levels.

However, if using the triple-well structure that includes all the P-well regions in the N-well region, a contact region for supplying potentials to the P-well region needs to be ensured on the surfaces of the P-well regions on the semiconductor substrate, independently of an MOS transistor region, and a problem for increasing the chip area is caused.

Then, in order to supply the potentials to the P-well regions surrounded by the N-well region and electrically connect the bottoms of the P-well regions to the semiconductor substrate, it is proposed that a through-hole pierced through the N-well region is arranged.

As a consequence, a predetermined potential level is supplied to the P-well region from the semiconductor substrate without causing the problem for increasing the chip area while keeping the advantage for preventing the noises from the semiconductor substrate and the injection of the current of minority carrier on the semiconductor substrate.

As disclosed in Patent Document 1, upon forming the through-hole pierced through the N-well region, it is necessary that an N-type-impurity is not guided to the through-hole (case 1). Alternatively, it is necessary that a P-type impurity is guided to a region of the through-hole so as to compensate for the N-type-impurity guided to the region of the through-hole (case 2).

Further, in order to prevent the influence to the P-well surface on the top from the impurity guided to form the through-hole pierced through the N-well region, the following requirements should be satisfied. In the case 1, the guiding of the impurity needs not to be completely prevented outside the border line of the region of the through-hole and, on the other hand, the guiding of the impurity needs to be completely shut-off inside the border line. In the case 2, on the contrary, the guiding of the impurity needs to be completely shut-off outside the border line of the region of the through-hole and, on the other hand, the guiding of the impurity needs not to be completely prevented inside the border line.

However, the above operation is not possible by setting, as a mask, resist patterned to prevent the guiding of the impurity, arranged at the border of the region of the through-hole. As a consequence, at the border portion of the region of the through-hole, the incompletely-guided impurity is distributed from the bottom of the P-well region to the surface of the P-well region. Therefore, the concentration of the impurity at the P-well region at the border portion of the through-hole region is not constant. Accordingly, characteristics of a transistor formed at the border portion of the through-hole region, such as current leakage characteristics between terminals of the transistor, are harmfully influenced from the concentration of the impurity at the border portion of the through-hole region.

SUMMARY OF THE INVENTION

According to one aspect of an embodiment, there is a semiconductor apparatus having a semiconductor substrate that is entirely a first conductive type; and a first well-region of the second conductive type that is formed to a surface layer of the semiconductor substrate; a first-conductive-type second well-region that is formed to the surface layer of the semiconductor substrate in contact with the first well-region; and a transistor that is formed to the second well-region; a through-hole region that is formed to be pierced through the first well-region, and enables the second well-region to be electrically conductive to the semiconductor substrate on the bottom of the second well-region, wherein the border of the through-hole region is arranged to be planarity apart from the transistor.

According to another aspect of an embodiment, there is a manufacturing method of a semiconductor apparatus having forming a first-conductive-type first well-region in a semiconductor substrate including a surface of the semiconductor substrate that is entirely a first conductive type; and forming a first-conductive-type second well-region in the first well-region from the surface of the semiconductor substrate toward the semiconductor substrate; forming a transistor in the first well-region; and a through-hole region that is formed to be pierced through the first well-region and enables the second well-region to be electrically conductive to the semiconductor substrate on the bottom of the second well-region, wherein the border of the through-hole region is arranged to be planarity apart form the transistor.

DESCRIPTION OF THE PREFERRED EMBODIMENTS

1. First Embodiment

The first embodiment will be described with reference to FIGS. 1A to 1C, FIGS. 2A and 2B, FIGS. 3A to 3D, FIGS. 4A to 4C, and FIGS. 5A and 5B. Further, the first embodiment of the present invention relates to the triple-well structure of a semiconductor apparatus having a CMOS transistor.

Figures 1A, 1B, 1C:
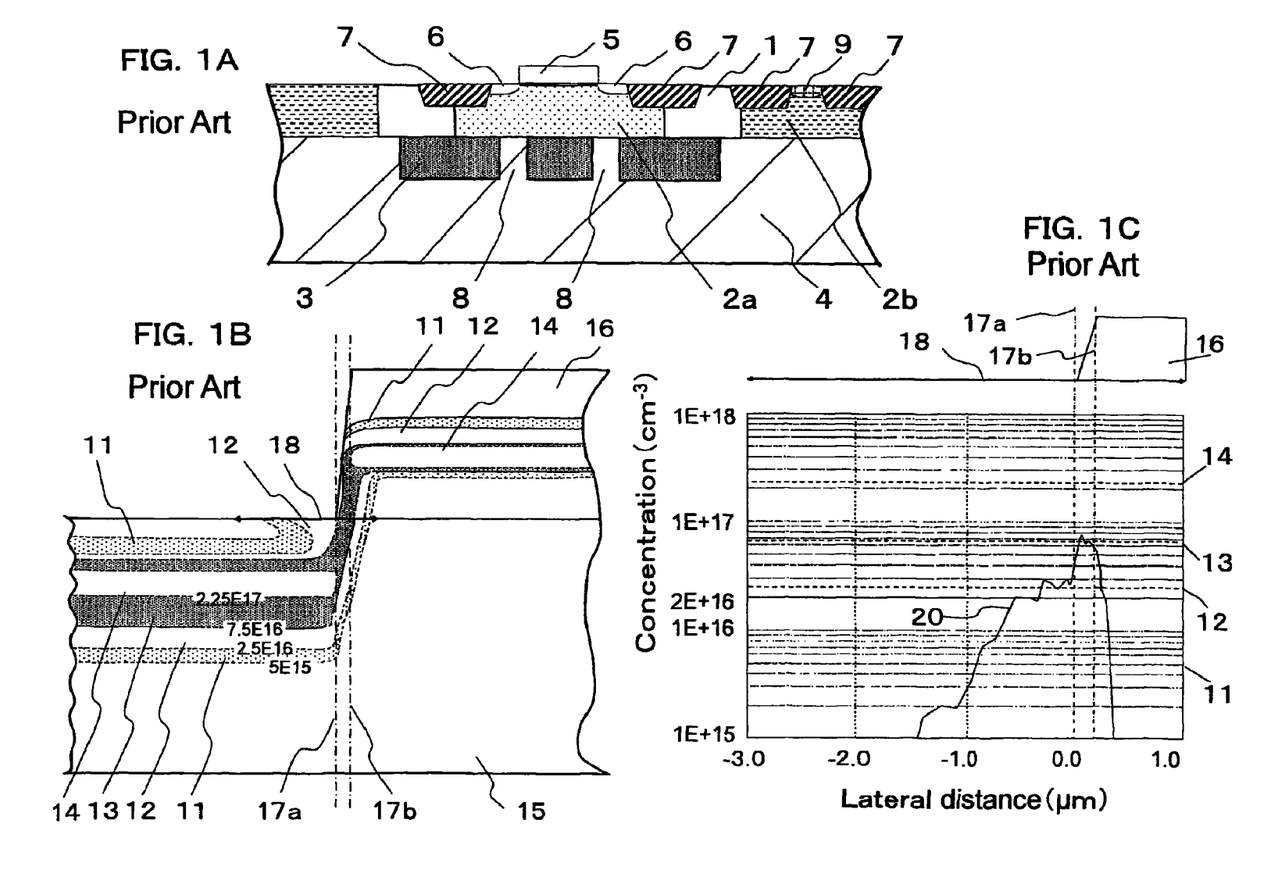
FIG. 1 includes FIGS. 1A, 1B, and 1C, and is a diagram for specifically illustrating a conventional triple-well structure and a problem thereof.

First of all, a problem of a conventional semiconductor apparatus will be described in details with reference to FIGS. 1A to 1C. FIG. 1A shows, an N-well region 1 with a shallow injection-depth of impurity, a P-well region 2a forming the triple-well structure, a P-well region 2b without the triple-well structure, an N-well region 3 with a deep injection-depth of impurity, a P-type semiconductor substrate 4, gate electrode and channel region 5 of an MOS transistor, a source and drain region 6, an element separating region 7 comprising a thick oxide film, a through-hole region 8 that enables the P-well region to be conductive to the semiconductor substrate, and a well tap 9 that supplies potentials to the P-well region 2b without the triple-well structure. Moreover, FIG. 1B shows a cross-section of a semiconductor substrate 15 and resist 16, and further shows an equal isoconcentration 11 indicating $5E15/cm^3$, an equal isoconcentration 12 indicating $2.5E16/cm^3$, an equal isoconcentration 13 indicating $7.5E16/cm^3$, an equal isoconcentration 14 indicating $2.25E17/cm^3$, the semiconductor substrate 15, the resist 16, dotted lines 17a and 17b indicating a region having a diagonal-shaped cross-section of the resist 16, and an arrow 18 showing a constant range of the semiconductor surface. In addition, FIG. 1C shows a region where the resist 16 exists, the positions of the dotted lines 17a and 17b, the arrow 18 of the semiconductor surface shown in FIG. 1B, a graph showing the impurity concentration of the surface of the semiconductor substrate 15 within a range along the arrow 18 of the semiconductor surface, and a broken line 20 showing the impurity concentration in the graph. Incidentally, the equal isoconcentration 11 indicating $5E15/cm^3$, the equal isoconcentration 12 indicating $2.5E16/cm^3$, the equal isoconcentration 13 indicating $7.5E16/cm^3$, the equal isoconcentration 14 indicating $2.25E17/cm^3$, and the broken line 20 indicating the impurity concentration are deprived on the basis of a result of obtaining the impurity distribution with simulation of a calculator using the Monte Carlo method.

FIG. 1A shows that the N-well region 3 with the deep injection-depth of impurity and the N well-region 1 with the shallow injection-depth of impurity are formed in the P-type semiconductor substrate 4 that entirely P-typed. Further, FIG. 1A also shows that the P-well region 2a forming the triple-well structure is formed in the N-well region comprising the N-well region 3 with the deep injection-depth of impurity and the N-well region 1 with the shallow injection-depth of impurity. Furthermore, FIG. 1A also shows that the MOS transistor and the element separating region 7 are formed in the P-well region 2a forming the triple-well structure. The MOS transistor comprises the gate electrode and channel region 5 and the source and drain region 6. In addition, the MOS transistor is arranged to the top of the through-hole region 8. FIG. 1A also shows that the element separating region 7 and the well tap 9 are formed in the P-well region 2b without the triple-well structure. Incidentally, the well tap 9 has a function for supplying potentials to the P-well region 2b without the triple-well structure. Further, the potentials supplied from the well tap 9 are supplied, via the through-hole region 8, to the P-well region 2a forming the triple-well structure.

FIG. 1B shows a cross-section of the resist 16 and the semiconductor substrate 15, arranged at the border portion of the through-hole region 8, as injection masks of impurity, in step of injecting the impurity forming the N-well region 3 with the deep injection-depth of the impurity and the through-hole region 8. Further, FIG. 1B also shows the concentration distribution of the impurity as the equal isoconcentrations 11, 12, 13, and 14 after injecting the impurity from the normal direction of the semiconductor substrate so as to form the N-well region 3 with the deep injection-depth of impurity and the through-hole region 8. Furthermore, the dotted line 17a shown in FIG. 1B denotes the end of the resist 16. The dotted line 17b shown in FIG. 1B denotes the border between a region having an unequal thickness of the resist 16 and a region having an equal thickness thereof. Moreover, the arrow 18 shown in FIG. 1B denotes a range in the lateral direction shown in the graph of FIG. 1C.

At a region where there is not the resist 16 on the surface of the semiconductor substrate 15 shown in FIG. 1B, the semiconductor substrate 15 includes a band-like impurity region with high concentration, surrounded by the equal isoconcentration 14 indicating $2.25E17/cm^3$, at the position as center, having a depth of 1.5 μm from the surface of the semiconductor substrate 15, and further includes an N-type-impurity region surrounded by the equal isoconcentration 13 indicating $7.5E16/cm^3$, the equal isoconcentration 12 indicating $2.5E16/cm^3$, and the equal isoconcentration 11 indicating $5E15/cm^3$ in the vertical direction to sandwich the impurity region with high concentration.

On the other hand, at a region sandwiched by the dotted line 17a and the dotted line 17b shown in FIG. 1B, the resist 16 and the semiconductor substrate 15 include an impurity region surrounded by the equal isoconcentration 13 indicating $7.5E16/cm^3$ in the longitudinal direction, and further includes an impurity region surrounded by the equal isoconcentration 12 indicating $2.5E16/cm^3$ on both sides of the impurity region.

Herein, the above-mentioned impurity regions are formed by the following reasons. First, at the region sandwiched by the dotted line 17a and the dotted line 17b, the thickness of the resist 16 is unequal, and is gradually thicker. That is, the cross-section of the resist 16 is diagonal. Then, since injection energy of the impurity colliding with the resist is reduced in accordance with the thickness of the resist 16, the impurity mainly remains at a sufficiently-thick position of the resist 16. On the other hand, at a thin position of the resist 16, the impurity mainly passes through the resist and reaches the substrate. Further, in accordance with the injection energy reduced by the resist 16, averages of the injection depth of the impurity to the semiconductor substrate 15 are different.

Therefore, since the impurities reaching the substrate are distributed between a place with a depth of 1.5 µm having the impurity region with high concentration and the surface thereof at a region without the resist 16, the impurity region in the longitudinal direction is formed. Further, since the impurities remaining at the diagonal portion at the end of the resist 16 are distributed along the shape of the diagonal portion, the impurity region in the longitudinal direction is formed in the resist 16.

At a region including the resist 16 on the surface of the semiconductor substrate 15 and excluding the region sandwiched by the dotted line 17a and the dotted line 17b, the thickness of the resist 16 is substantially equal. Then, the impurity stops in the resist, and a band-like impurity region with high concentration at the position, as center, of 2.0 µm from the surface of the resist 16, surrounded by the equal isoconcentration 14 indicating $2.25E17/cm^3$ is formed in the resist 16. Further, the impurity region surrounded by the equal isoconcentration 13 indicating $7.5E16/cm^3$, the equal isoconcentration 12 indicating $2.5E16/cm^3$, and the equal isoconcentration 11 indicating $5E15/cm^3$ is formed to sandwich the impurity region with high concentration in the vertical direction thereof.

The graph shown in FIG. 1C indicates the impurity distribution on the surface of the semiconductor substrate 15 within a range shown by the arrow 18 in FIG. 1B. The abscissa in the graph of FIG. 1C denotes the distance in the lateral direction from the origin, ranging from −3.0 µm to +1.0 µm, with a cross point of the dotted line 17a shown in FIG. 1B and the surface of a semiconductor substrate 15 as the origin of the abscissa. The ordinate in the graph shown in FIG. 1C denotes a range of the impurity concentration from $1E15/cm^3$ to $1E18/cm^3$. At the point of −1.5 µm, the impurity concentration of the broken line 20 rises from $1.5E15/cm^3$, and gradually rises up to the origin. At the position in the positive region from the origin, the impurity concentration indicates $8E16/cm^3$ at the top and sharply drops as the position is apart from the origin. Because the range shown by the arrow 18 includes the region sandwiched by the dotted line 17a and the dotted line 17b, forming the impurity region in the longitudinal direction. Thus the situation in which the impurity concentration is higher nearer to the border of the presence or absence of the resist 16 is reflected.

Referring to FIGS. 1A, 1B, and 1C, upon forming the through-hole region 8 in the N-well region 3 with the deep injection-depth of impurity, the injection of the N-type-impurity to the semiconductor substrate cannot be completely shut-off at the border of the through-hole region 8. Therefore, on the surface of the P-well region 2a forming the triple-well structure, the impurity distribution shown in FIG. 1C is formed. Then, the conventional triple-well structure has a problem that characteristics of the MOS transistor in the P-well region 2a forming the triple-well structure, overlapped to the border portion of the through-hole region 8, are unstable, as compared with characteristics of another MOS transistor. For example, there is a problem that the leakage characteristics between a source terminal and a drain terminal deteriorate among the characteristics of the MOS transistor in the P-well region 2a forming the triple-well structure, overlapped to the border portion of the through-hole region 8. The operation of the P-type impurity of the P-well region 2a is offset by the N-type-impurity, and the state is thus the same as the reduction of the concentration of the P-type impurity in the P-well region 2a, thereby deteriorating an electrical withstand voltage of a P-N junction comprising the P-well region 2a at the border portion of the through-hole region 8 and the source and drain region 6.

Further, depending on the size of the through-hole region pierced through the N-well region on the bottom of the P-well region and the arrangement position of the through-hole region, the operation for feeding power to the P-well region is unstable, and characteristics of the transistor on the P-well region are also unstable.

Furthermore, in order to form a deep N-well region and the through-hole region, the N-type-impurity needs to be injected to the deep N-well region with high energy, and a fine pattern cannot be thus formed. Generally, the size of the through-hole region is necessarily larger than the size of the entire transistor. Then, as disclosed in Patent Document 1, the through-hole region is arranged, not just under the transistor, the P-well region is thus increased by the through-hole region, and the size of the P-well region is not reduced.

Figure 2A:
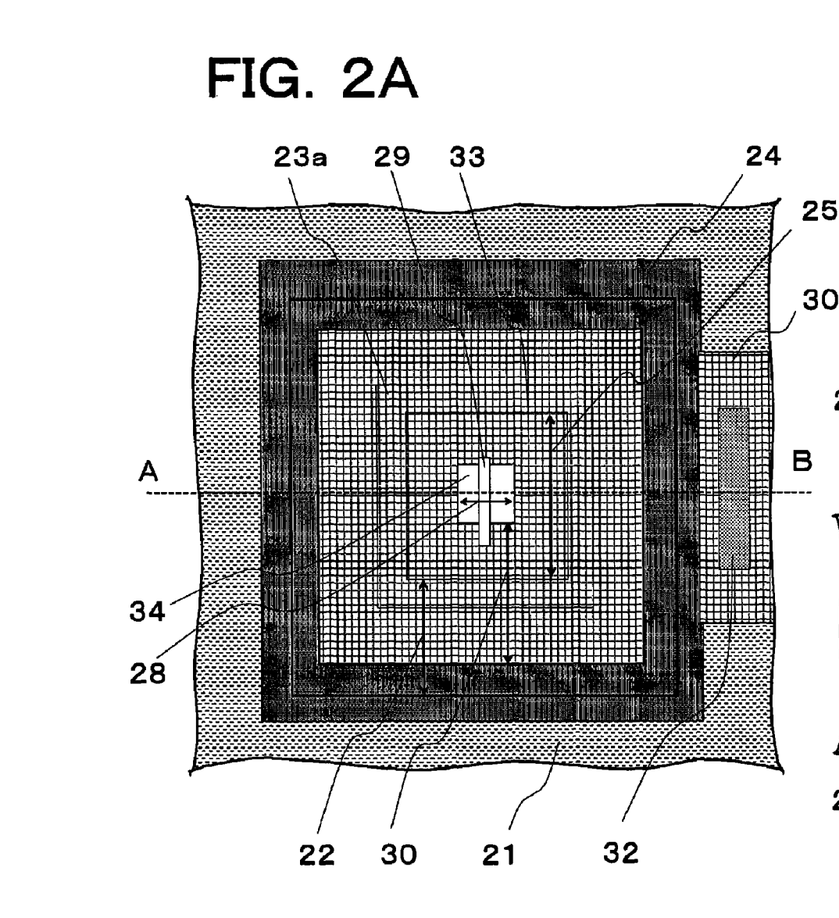
FIG. 2 includes FIGS. 2A and 2B, and shows a cross-sectional view and a plan view of a semiconductor apparatus according to the first embodiment.

FIG. 2A is a plan view showing the semiconductor apparatus according to the first embodiment, and FIG. 2B is a cross-sectional view showing the semiconductor apparatus according to the first embodiment. FIG. 2A planarity shows the arrangement of a P-type semiconductor substrate 21, an N-well region comprising an N-type-impurity region 22 with a deep injection-depth of the impurity and an N-type-impurity region 24 with a shallow injection-depth of impurity, a P-well region 23a having a triple structure, a P-well region 23b, a through-hole region 25, an STI (shallow trench isolation) 30, a well tap 32, a border 33 of the through-hole region, and an MOS transistor 34. Further, FIG. 2A shows that a field region 28 for determining the MOS transistor 34, a gate electrode 29 of the MOS transistor 34, the MOS transistor 34, and an STI 30 for electrical insulation of the well tap 32 are formed in the through-hole region 25. The N-well region is formed in the P-type semiconductor substrate 21. The P-well region 23 is formed to the inside of the N-well region, that is, surrounded by the N-well region. The through-hole region 25 is arranged to the inside of the P-well region 23a, serving as a region for connecting the P-well region 23a to the P-type semiconductor substrate 21. Further, the N-type-impurity region 22 with the deep injection-depth of the impurity, the border 33 of the through-hole region 25, and the MOS transistor 34 are planarity apart from each other. Herein, the distance between the border 33 of the through-hole region 25 and the MOS transistor 34 ranges from the origin shown in FIG. 1C to the position where the N-type-impurity concentration is reduced to predetermined concentration. Incidentally, at the distance for reducing the N-type-impurity concentration to predetermined concentration, the N-type-impurity is reduced to the concentration that does not influence to the MOS transistor 34, e.g., this distance denotes the distance for reducing the N-type-impurity concentration from the origin shown in FIG. 1C to approximately $2E16/cm^3$.

Figure 2B:
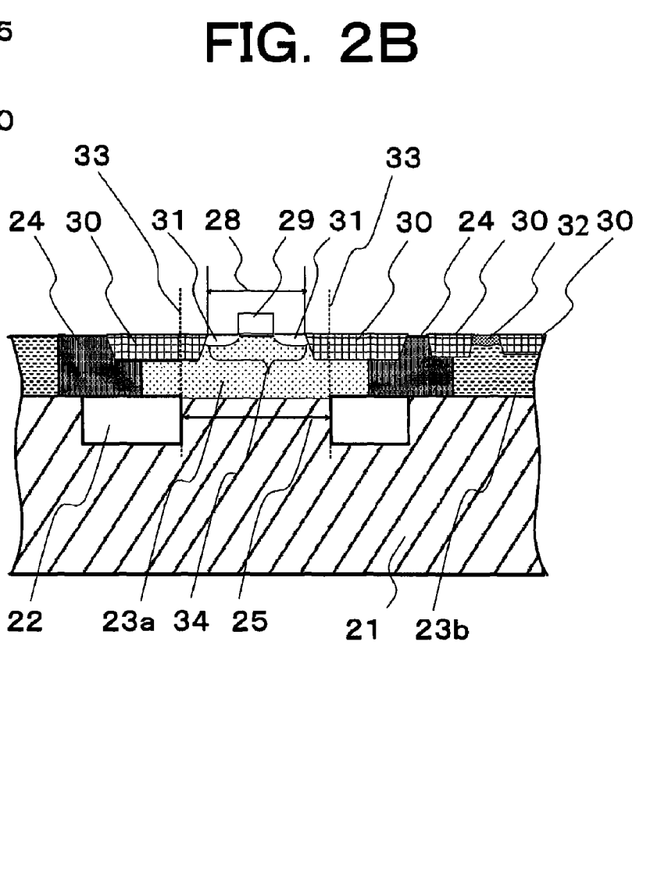

FIG. 2B is a cross-sectional view of a place shown by a dotted line between A to B in FIG. 2A. Further, the N-well region is extended from the P-type semiconductor substrate 21 to the inside of the P-type semiconductor substrate 21. Incidentally, the N-type-impurity region 24 with the shallow injection-depth of impurity is arranged to the surface of the N-well region, and the N-type-impurity region 22 with the deep injection-depth of the impurity is arranged to the bottom of the N-well region. Further, the P-well region 23a is widened from the surface of the P-type semiconductor substrate 21 to the inside of the N-well region. The through-hole region 25 is pierced through the N-well region from the bottom of the P-well region and is connected to the P-type semiconductor substrate. Further, the circumference of the through-hole region 25 is the border region 33. Furthermore, the P-type semiconductor substrate 21, the N-well region, and the P-well region 23a form a so-called triple-well structure. In addition, FIG. 2B shows a cross-section of the field region 29 for determining the MOS transistor 34, formed in the P-well region 23a, the electrode 28 of the MOS transistor 34, the STI 30, and source and drain 31 of the MOS transistor 34. FIG. 2B shows that the STI 30 and the well tap 32 are formed in the P-well region 23b that does not form the triple-well structure. Incidentally, the well tap 32 has a function for supplying potentials to the P-well region 23b that does not form the triple-well structure. Further, the potentials supplied from the well tap 32 are also supplied to the P-well region 23a forming the triple-well structure through the through-hole region 25.

FIGS. 3A, 3B, 3C, and 3D are cross-sectional views schematically showing steps of manufacturing the semiconductor apparatus shown in FIG. 2. FIGS. 4A, 4B, 4C, and 4D are cross-sectional views schematically showing steps of manufacturing the semiconductor apparatus shown in FIG. 2, after the step shown in FIG. 3D.

FIGS. 3A, 3B, 3C, 3D, 4A, 4B, 4C, and 4D show a semiconductor substrate 35, an N-type-impurity region 36 with a deep injection-depth of the impurity, a resist opening pattern 37, an STI 38, a resist opening pattern 39, an N-type-impurity region 40 with a shallow injection-depth of the impurity, polysilicon layer and gate oxide film 41, a resist pattern 42, a gate electrode 43 of the MOS transistor, source and drain 44 of the MOS transistor, a through-hole region 45, a P-well region 46a forming the triple-well structure, a P-well region 46b without forming the triple-well, a resist pattern 47, and a well tap 48.

Figure 3A:
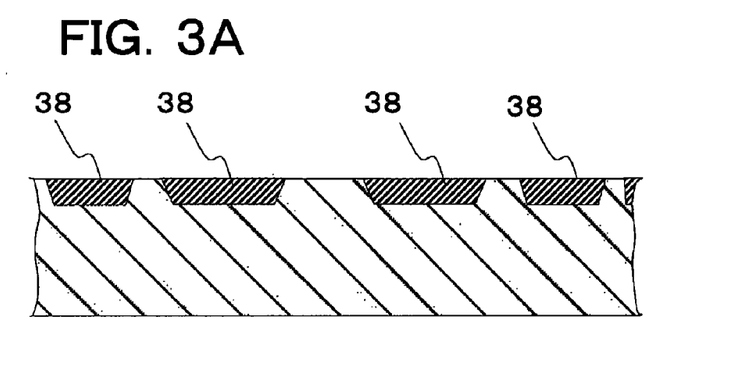
FIG. 3 includes cross-sectional views 3A, 3B, 3C, and 3D, and is a diagram schematically showing manufacturing steps of the semiconductor apparatus shown in FIG. 2.

FIG. 3A shows that the STI 38 is formed to separate the element. The STI 38 is formed as follows. First, a groove of 0.5 µm is formed in the semiconductor substrate 35. Subsequently, the surface of the semiconductor substrate 35 is oxidized. Subsequently, an insulating layer is deposited on the semiconductor substrate 35 so as to fill the groove with the insulating material. Subsequently, an insulating layer at the position except for the groove is removed by CMP (chemical mechanical polishing), thereby completing the STI 38.

Figure 3B:
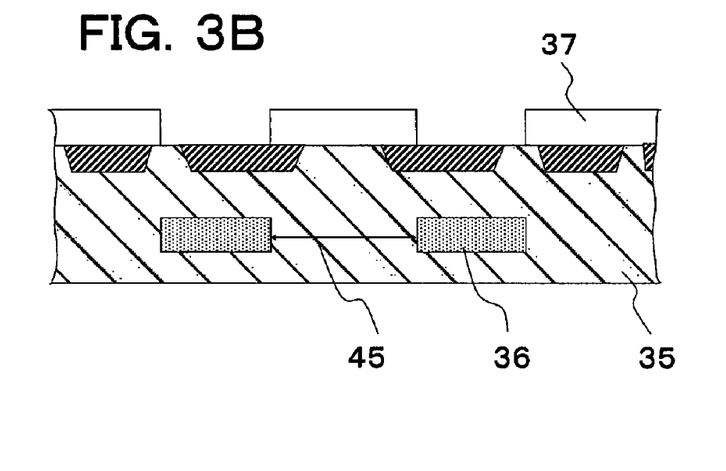

FIG. 3B shows that resist is coated onto the semiconductor substrate 35, the resist opening pattern 37 is formed by a photolithography step, and the through-hole region 45 and the N-type-impurity region 36 with the deep injection-depth of the impurity are formed by ion injection. The resist opening pattern 37 has an opening corresponding to the N-type-impurity region 36 with the deep injection-depth of the impurity. That is, the resist opening pattern 37 does not have the resist pattern on the N-well region, and however has the resist pattern at the portion corresponding to the through-hole region 45. Therefore, the through-hole region 45 is completed by covering the injection of the impurity with the resist pattern.

However, if the resist opening pattern 37 does not have the resist pattern portion that covers the through-hole region 45, the through-hole region 45 can be formed. In this case, the through-hole region 45 is formed as follows. First, the N-type-impurity is ion-injected to the N-type-impurity region 36 with the deep injection-depth of the impurity. In this case, the N-type-impurity is also guided to the through-hole region 45. Then, resist is coated again, a resist pattern is formed with an opening at the portion corresponding to the through-hole region 45 by the photolithography step, and the P-type impurity for compensating for the N-type-impurity is injected. As a consequence, the through-hole region 45 is completed in the N-type-impurity region 36 with the deep injection-depth of the impurity by the compensation of the P-type impurity.

Figure 3C:
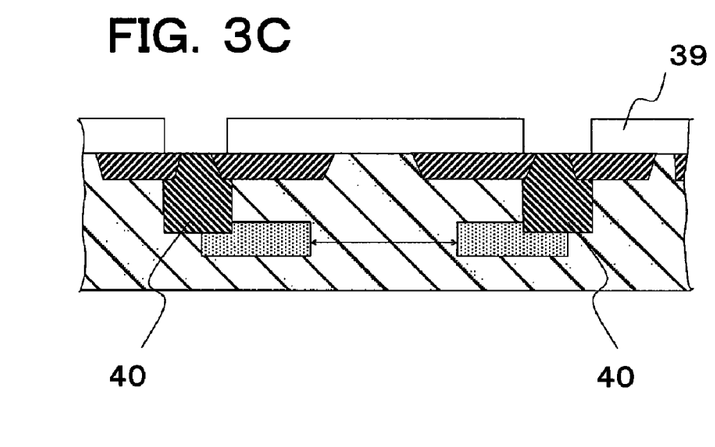

FIG. 3C is a diagram showing that the N-type-impurity region 40 with the shallow injection-depth of the impurity is formed and the N-well region is also formed. In order to form the N-type-impurity region 40 with the shallow injection-depth of the impurity, first, resist is coated, and the resist opening pattern 39 is formed to be planarity overlapped to the N-type-impurity region 36 with the deep injection-depth of the impurity by the photolithography step. Subsequently, with ion injection, the N-type-impurity region 40 with the shallow injection-depth of the impurity is formed. Accordingly, the N-type-impurity region 36 with the deep injection-depth of the impurity is connected to the N-type-impurity region 40 with the shallow injection-depth of the impurity, thereby forming the N-well region. Further, the P-well region surrounded by the N-well region is also formed.

Figure 3D:
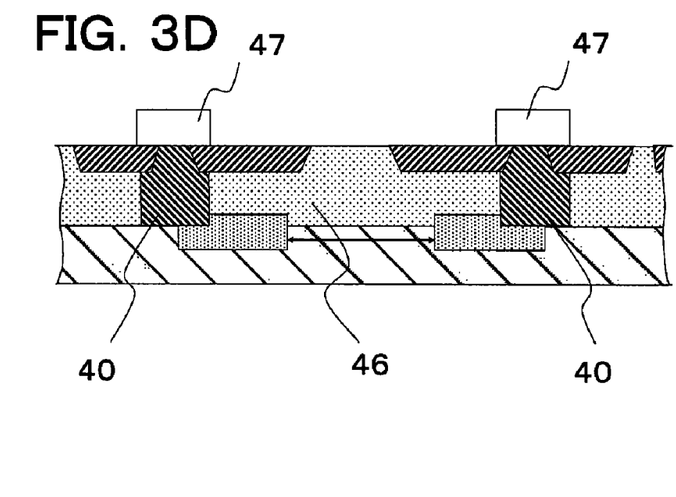

FIG. 3D is a diagram showing that the P-well region 46a forming the triple-well structure and the P-well region 46b without forming the triple-well structure are formed. First of all, resist is coated to the resist pattern 47 that covers the N-type-impurity region 40 and the P-well regions 46a and 46b are formed by the photolithography step. Subsequently, by using the resist pattern 47 as a mask, the P-type impurity is ion-injected. Thereafter, the resist pattern 47 is removed.

Figure 4A:
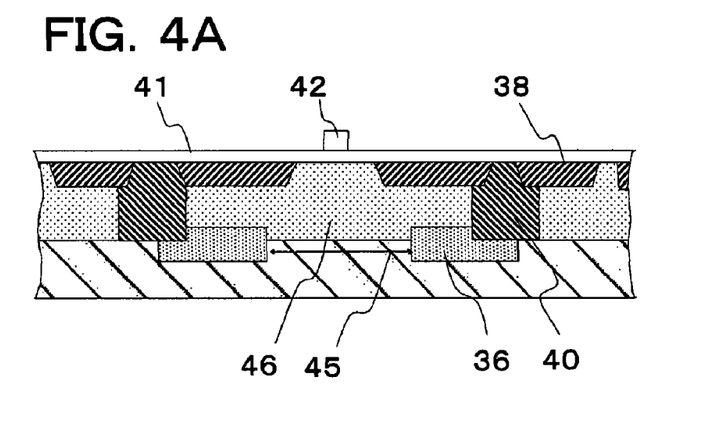
FIG. 4 includes cross-sectional views 4A, 4B, 4C, and 4D, and is a diagram schematically showing manufacturing steps of the semiconductor apparatus shown in FIG. 2.

FIG. 4A is a diagram showing that the resist pattern 42 used for forming the gate electrode 43 of the MOS transistor is created. Before creating the resist pattern 42, the resist opening pattern 39 is removed, gate oxidation is performed, and a polysilicon layer is deposited, thereby forming the polysilicon layer and gate oxide film 41. Subsequently, resist is coated, and the resist pattern 42 used for forming the gate electrode 43 of the MOS transistor is created by the photolithography step.

Figure 4B:
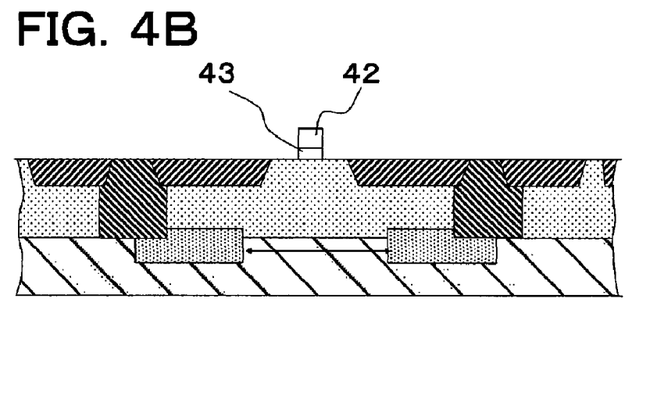

FIG. 4B is a diagram showing that the gate electrode 43 of the MOS transistor is formed. The gate electrode 43 of the MOS transistor is formed by etching the polysilicon layer and gate oxide film, 41 on the resist pattern 42 as the mask.

Figure 4C:
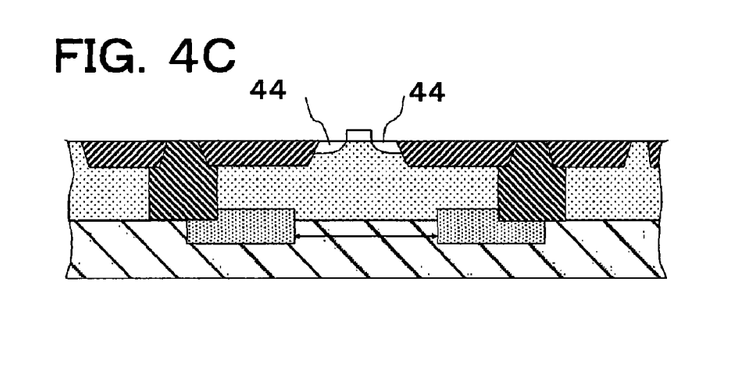

FIG. 4C is a diagram showing that the source and drain 44 of the MOS transistor is formed. In order to form the source and drain 44, first of all, resist is coated, and a resist pattern for forming the source and drain 44 is formed by the photolithography step. Further, the impurity for forming the source and drain 44 is ion-injected with the resist pattern as the mask. Subsequently, the resist pattern is removed, the impurity of the source and drain 44 is activated by thermal processing, and the source and drain region is completed.

Figure 4D:
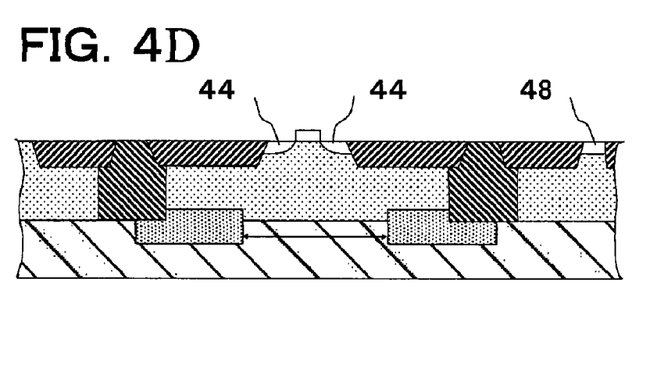

FIG. 4D is a diagram showing that the well tap 48 is formed to the P-well region 46b. In order to form the well tap 48, first of all, resist is coated, and a resist pattern for forming the well tap 48 is formed by the photolithography step. Further, the impurity for forming the well tap 48 is ion-injected with the resist pattern as the mask. Subsequently, the resist pattern is removed, and the well tap 48 is formed by thermal processing.

According to the first embodiment, the semiconductor apparatus according to the first embodiment has an N-well region created on the P-type semiconductor substrate and a P-well region formed at the N-well region, and further has a through-hole region pierced through the N-well region, serving as the bottom of the P-well region, so as to electrically connect the P-well region to the P-type semiconductor substrate. Furthermore, the MOS transistor in the through-hole region is apart from the border of the through-hole region. Therefore, with the semiconductor apparatus according to the first embodiment, the MOS transistor is stably operated without the influence from the impurity at the border of the through-hole region to the MOS transistor. For example, advantageously, with the N-type-impurity at the border of the through-hole region, leakage characteristics between the source terminal and the drain terminal in the MOS transistor are not harmfully influenced.

Moreover, the size of the through-hole region pierced through the N-well region on the bottom of the P-well region is large to include the MOS transistor. The arrangement position of the through-hole region is just below the MOS transistor. Therefore, the through-hole region is not closed by widening a hollow layer due to the P-N junction, and power is stably supplied to the P-well region. In addition, the power supply is stable, thereby stabilizing characteristics of the transistor on the P-well region.

In addition, the through-hole region is arranged just below the transistor, and the transistor is planarity overlapped to the through-hole region, thereby easily reducing the size of the P-well region, as compared with the case of independently arranging the through-hole region.

Incidentally, according to the first embodiment, the MOS transistor is formed in the P-well region forming the triple-well structure, and the border of the through-hole region harmfully influences to the characteristics of the MOS transistor, as mentioned above. On the other hand, the border of the through-hole region according to the first embodiment can harmfully influence to the operation of a transistor except for the MOS transistor, e.g., a bipolar transistor. At the border of the through-hole of the P-well region, the reduction in withstand voltage of the operation of the P-N junction due to the N-type-impurity can deteriorate the leakage characteristics between terminals of the bipolar transistor. Then, according to the first embodiment, the transistor is planarity apart from the border of the through-hole region, and this is obviously advantageous to a transistor other than the MOS transistor.

2. Second Embodiment

The second embodiment will be described with reference to FIGS. 5A, 5B, 6A, 6B, and 6C. According to the second embodiment, a plurality of NMOS transistors are created in the P-well region, and the border of the through-hole region is arranged between the NMOS transistors.

Figure 5A:
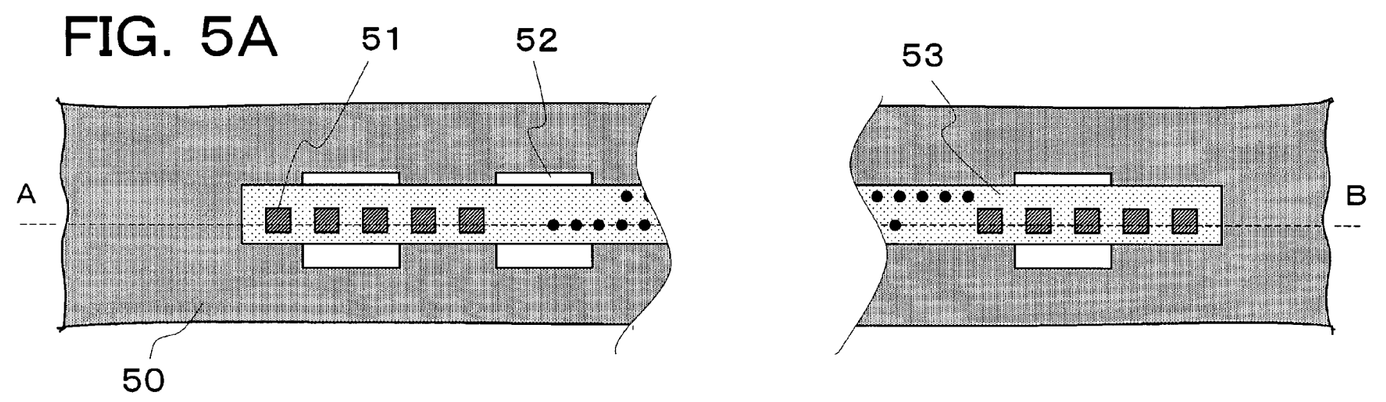
FIG. 5 shows a plan view and a cross-sectional view of a semiconductor apparatus according to the second embodiment.
Figure 5B:
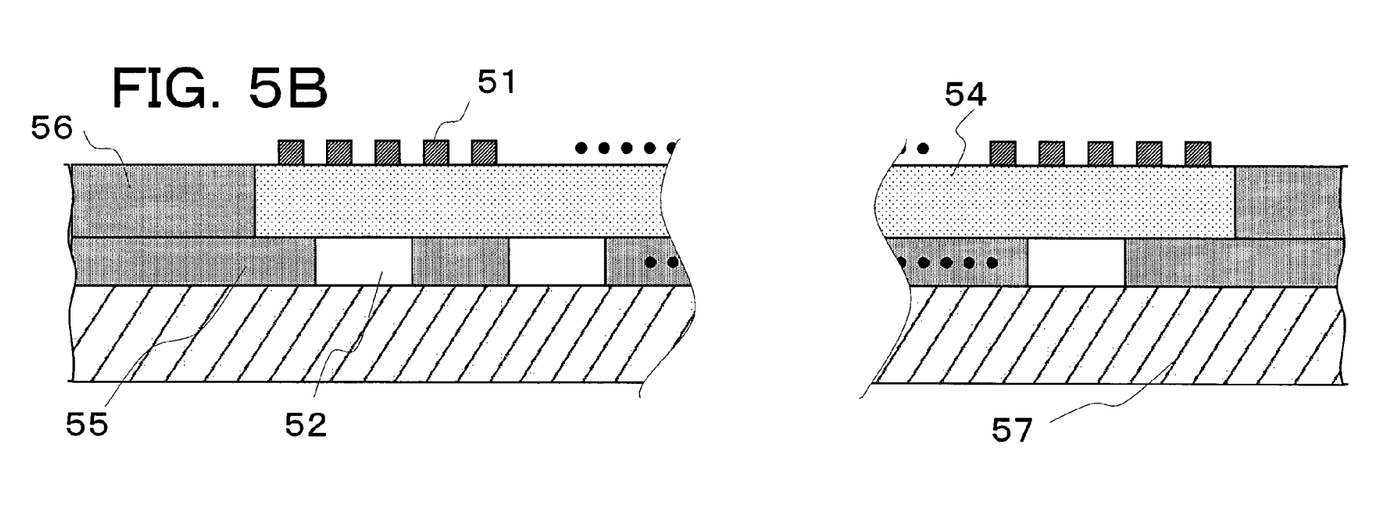

FIG. 5A is a plan view showing a semiconductor apparatus according to the second embodiment, and FIG. 5B is a cross-sectional view showing the semiconductor apparatus according to the second embodiment. FIG. 5A shows a region 50 where the N-type-impurity with a deep injection-depth of the impurity is planarity overlapped to the N-type-impurity with a shallow injection-depth of the impurity, an NMOS transistor 51, a through-hole region 52, and a region 53 where the P-well region is planarity overlapped to the N-type-impurity region with a deep injection-depth of the impurity. Incidentally, the structures of the gate electrode and the source and drain of the NMOS transistor 51 are omitted and the NMOS transistor 51 is entirely rectangular as a typical example.

FIG. 5B is a cross-sectional view of an A-B line shown in the planar view of FIG. 5A, and also shows an N-type-impurity region 56 with a shallow injection-depth of the impurity that is extended from the surface of a P-type semiconductor substrate 57 to the inside thereof, a P-well region 54 that is extended form the surface of the P-type semiconductor substrate 57 to the inside thereof, an N-type-impurity region 56, an impurity region 55 with a deep injection-depth of the impurity on the bottom of the P-well region 54, a through-hole region 52 on the bottom of the P-well region 54, pierced through the impurity region 55 with the deep injection-depth of the impurity, and an NMOS transistor 51 on the P-well region 54. Incidentally, the N-type-impurity region 56 with the shallow injection-depth of the impurity and the impurity region 55 with the deep injection-depth of the impurity form the N-well region, surrounding the P-well region 54.

Referring to FIGS. 5A and 5B, the semiconductor apparatus according to the second embodiment includes the N-well region created in the P-type semiconductor substrate 57 and the P-well region 54 created in the N-well region, and has the through-hole region 52 pierced through the N-well region from the bottom of the P-well region 54 so as to electrically connect the P-well region 54 to the P-type semiconductor substrate 57. Further, a plurality of NMOS transistors exist in the P-well region 54, and an NMOS transistor exists in the through-hole region 52. Then, the border of the through-hole region 52 is arranged between the NMOS transistor in the through-hole region 52 and the NMOS transistor out of the through-hole region 52. Further, the border of the through-hole region 52 is planarity apart from the NMOS transistor. Incidentally, the distance between the border of the through-hole region 52 and the NMOS transistor is preferably the distance from the origin in the graph shown in FIG. 1C to the point at which the N-type-impurity concentration is reduced to approximately $2E16/cm^3$, similarly to the first embodiment.

Therefore, with the semiconductor apparatus according to the second embodiment, the MOS transistor is stably operated without the influence from the impurity of the border of the through-hole region to the MOS transistor. For example, the harmful influence is not affected to the leakage characteristics between the source terminal and the drain terminal of the MOS transistor.

Further, since the MOS transistor region can be overlapped to the through-hole region, the through-hole region is not necessarily arranged independently, and the area of the P-well region 54 including both the MOS transistor region and the through-hole region can be reduced.

Figure 6A:
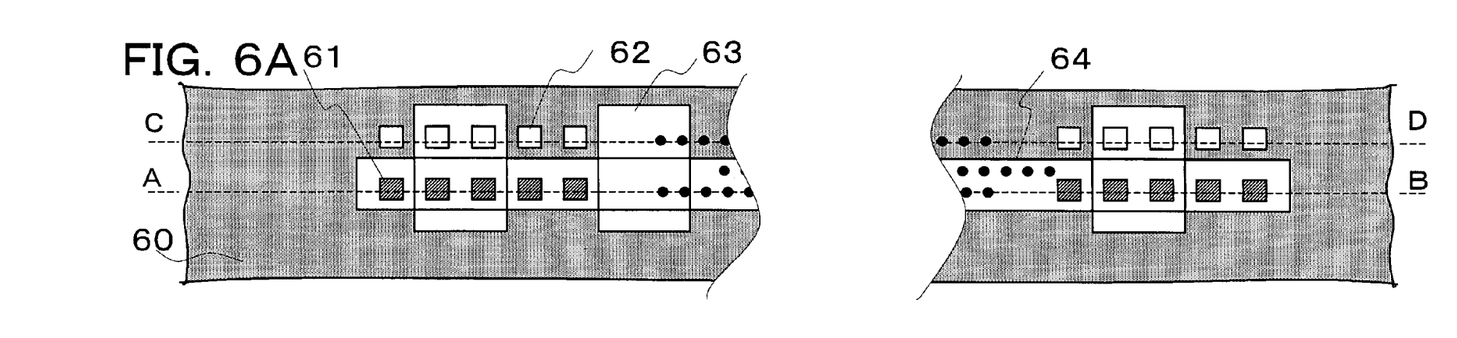
FIG. 6 shows a plan view and a cross-sectional view of a semiconductor apparatus according to a modification of the second embodiment described with reference to FIG. 5.
Figure 6B:
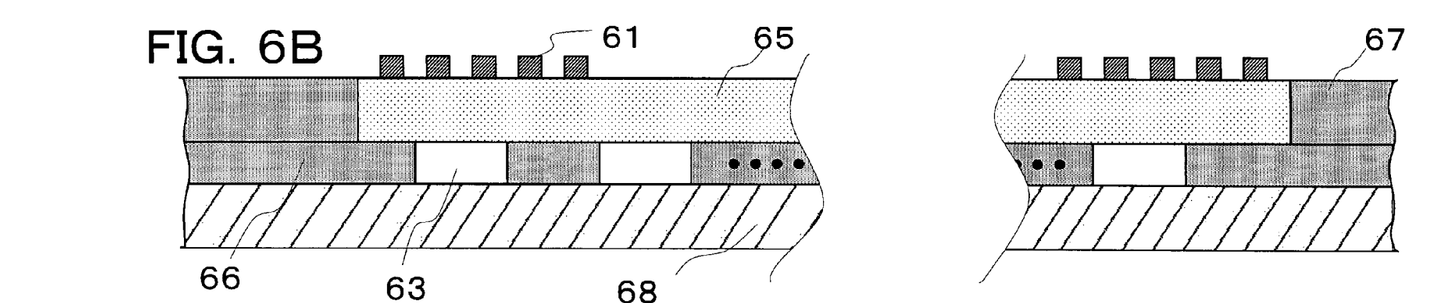
Figure 6C:
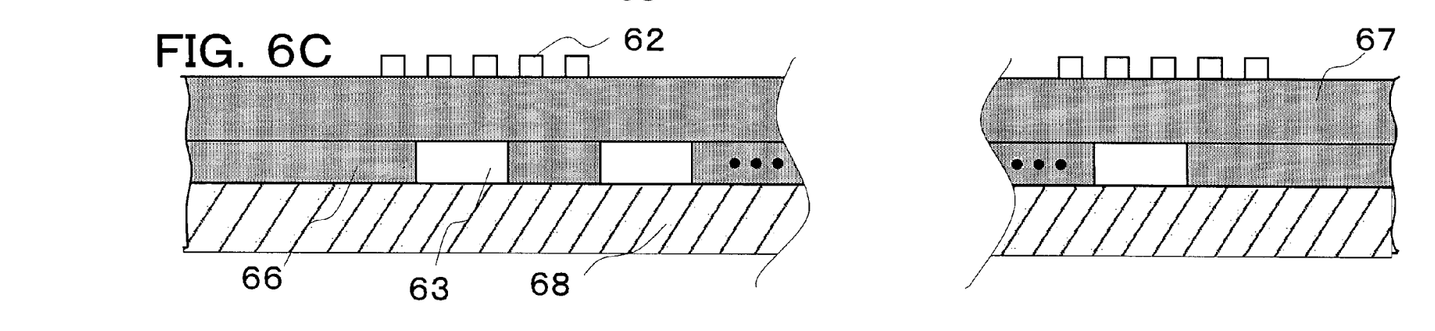

FIGS. 6A, 6B, and 6C are a plan view and cross-sectional views of a modification of the semiconductor apparatus shown in FIGS. 5A and 5B according to the second embodiment. FIG. 6A is a plan view, and shows a region 60 where the N-type-impurity with a deep injection-depth of the impurity is planarity overlapped to the N-type-impurity with a shallow injection-depth of the impurity, an NMOS transistor 61, a PMOS transistor 62, a through-hole region 63, and a region 64 where the P-well region is planarity overlapped to the N-type-impurity region with a deep injection-depth of the impurity.

FIG. 6B is a cross-sectional view of an A-B line shown in FIG. 6A, and shows an N-type-impurity region 67 with a shallow injection-depth of the impurity, extended from the surface of a P-type semiconductor substrate 68 to the inside thereof, a P-well region 65 extended from the surface of the P-type semiconductor substrate 68 to the inside thereof, an impurity region 66 with a deep injection-depth of the impurity on the bottom of the N-type-impurity region 67 and the P-well region 65, a through-hole region 63 on the bottom of the P-well region 65 pierced through the impurity region 55 with the deep injection-depth of the impurity, and the NMOS transistor 61 on the bottom of the P-well region 65. Incidentally, the N-type-impurity region 67 with the shallow injection-depth of the impurity and the impurity region 66 with the deep injection-depth of the impurity form the N-well region, surrounding the P-well region 65.

FIG. 6C is a cross-sectional view of a C-D line portion shown in FIG. 6A. As compared with FIGS. 6B and 6C, the P-well region 65 is not shown and, in place of the NMOS transistor 61 on the P-well region 65, the PMOS transistor 62 is shown on the N-type-impurity region 67 with the shallow injection-depth of the impurity. However, other points shown in FIG. 6B are similar to those shown in FIG. 6C.

Further, according to the modification of the second embodiment shown in FIGS. 6A, 6B, and 6C, the through-hole region 63 includes the PMOS transistor, unlike the second embodiment. However, other structure and arrangement are similar to those according to the second embodiment.

Therefore, with the semiconductor apparatus according to the modification of the second embodiment, the characteristics of the MOS transistor are not influenced from the impurity of the border of the through-hole region. Further, not only the NMOS transistor is stably operated but also the PMOS transistor is stably operated. For example, the leakage characteristics between the source and the drain of the PMOS transistor arranged to the border of the through-hole region are normal.

Further, since the MOS transistor region is overlapped to the through-hole region, the area of the P-well region 54 including both the MOS transistor region and the through-hole region can be reduced.

3. Third Embodiment

The third embodiment will be described with reference to FIGS. 7 and 8. The third embodiment relates to a semiconductor apparatus having an SRAM cell comprising an MOS transistor.

Figure 7:
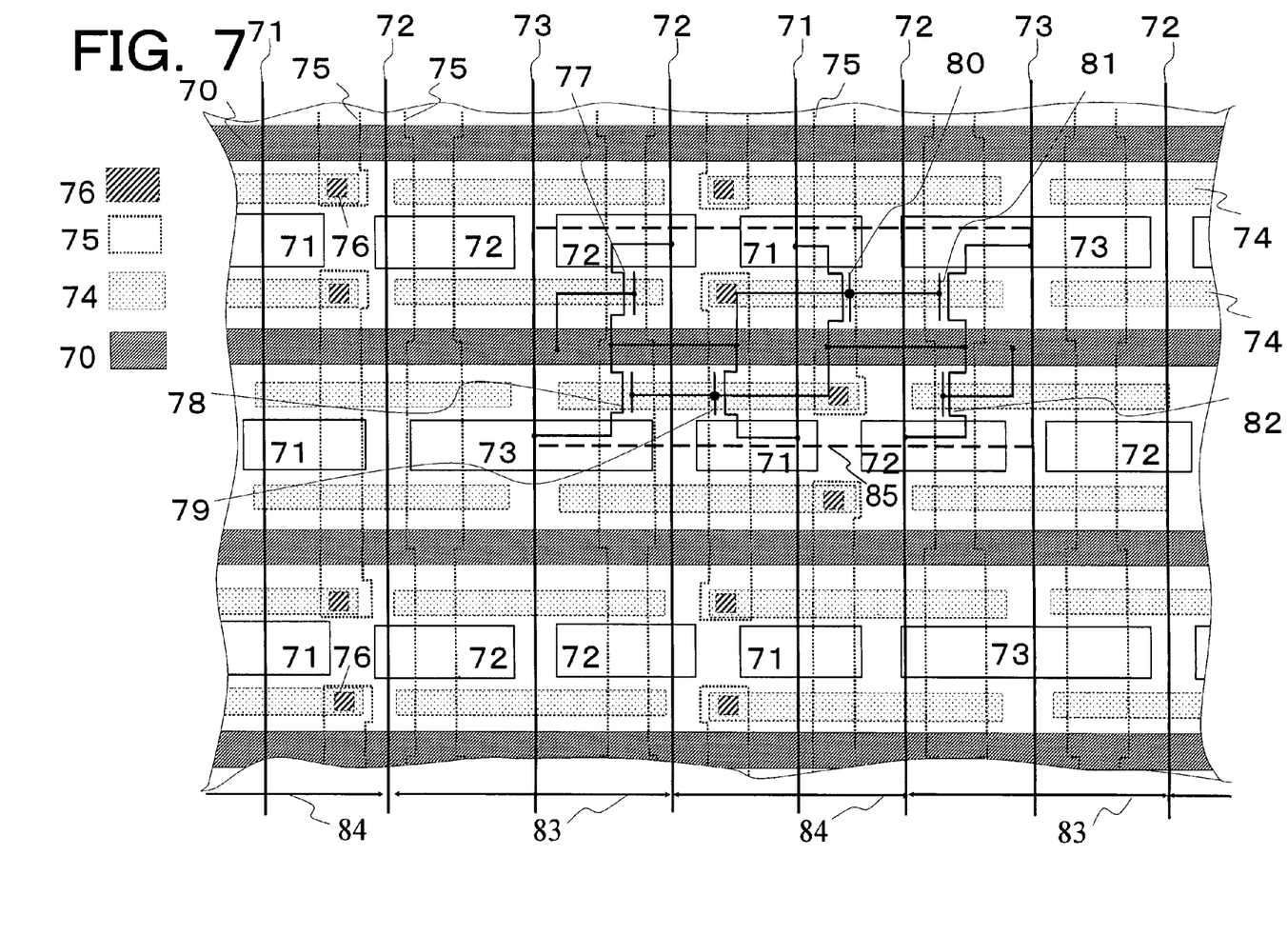
FIG. 7 is a plan view for illustrating the layout of an SRAM cell according to the third embodiment.

FIG. 7 is a plan view illustrating the layout of the SRAM cell in the semiconductor apparatus according to the third embodiment. Further, FIG. 7 shows a word line 70, a VDD line 71, a bit line 72, a GND line 73, a gate electrode 74 of an MOS transistor, a field region 75, a contact 76, an NMOS transistor 77, an NMOS transistor 78, a PMOS transistor 79, a PMOS transistor 80, an NMOS transistor 81, an NMOS transistor 82, a P-well region 83, an N-well region 84, and an SRAM cell 85.

The predetermined field region 75 and the gate electrode 74 of the predetermined MOS transistor are arranged under a constant rule, thereby arranging the MOS transistors in matrix with constant regularity. Further, from among the MOS transistors arranged in the matrix, the PMOS transistors 79 and 80 at the N-well region 84 are connected to the NMOS transistors 77, 78, 81, and 82 at the P-well region 83 with a wiring layer, as shown by a thick line in FIG. 7. Thus, the SRAM cell 85 is structured. Incidentally, except for the arrangement position of the contact 76, at the cross point of the field region 75 and the gate electrode 74 of the MOS transistor, a channel of the MOS transistor is formed. On the other hand, at the position of the arrangement of the contact 76, serving as the cross point of the field region 75 and the gate electrode 74 of the MOS transistor, the field region 75 is electrically connected to the gate electrode 74 of the MOS transistor.

Herein, with the above connection, the NMOS transistor 78 and the PMOS transistor 79 form an inverter circuit. The NMOS transistor 81 and the PMOS transistor 80 form an inverter circuit. Further, both the inverter circuits are cross-connected. Furthermore, the NMOS transistor 77 and the NMOS transistor 82 form a transfer gate of the SRAM cell.

The N-well region 84 and the P-well region 83 are planarily rectangular in the column direction, and are planarily alternately arranged. Herein, the width of the N-well region 84 is, e.g., approximately 0.5 μm. Further, the width of the P-well region 83 is, e.g., approximately 0.7 μm. Therefore, the N-well region 84 is planarity separated to the P-well region 83. However, the P-well region 83 is formed in the N-well region 84, and the N-well region 84 is further connected to a region with a deep injection-depth of the N-type-impurity on the bottom of the P-well region 83. That is, the N-well region 84 surrounds the entire matrix of the SRAM cells including the SRAM cell 85.

Incidentally, a pattern of the field region 75 according to the third embodiment is continuously extended in the column direction with a continuous stick-shaped pattern periodically-changed in width and a short stick-shaped pattern. The field region 75 is regularly arranged by iteratively arranging, in the column direction, an alignment A for arranging the continuously stick-shaped patterns in the column direction, an alignment B for arranging the short stick-shaped patterns, and an alignment C for arranging the short stick-shaped pattern so that the short stick-shaped patterns are alternately arranged with the alignment B. Further, the pattern of the gate electrode 74 of the MOS transistor according to the third embodiment is a long stick-shaped pattern having the length crossing two columns of the field region 75. Furthermore, with respect to the regular arrangement of the gate electrodes, long stick-shaped patterns are arranged in the row direction to cross two columns of the field region 75.

The VDD line 71 is expressed with a thick line and a rectangular-shaped wiring layer pattern, and is a wiring having a function for sending a power voltage on the high-voltage side to the SRAM cell 85. The rectangular-shaped wiring layer pattern is for connection to the field region 75, and is connected to sources of the PMOS transistors 79 and 80 forming the SRAM cell 85. The thick line of the VDD line 71 comprises a wiring layer, and expresses a wiring for connecting the rectangular-shaped patterns in the column direction of matrix. The bit line 72 is expressed by a thick line and a rectangular-shaped wiring layer pattern, and is a wiring having a function for transmitting a bit line signal to the SRAM cell 85. The rectangular-shaped wiring layer pattern is for connection to the field region 75, and is connected to source and drain regions of the NMOS transistor 77 forming the SRAM cell 85 and to source and drain regions of the NMOS transistor 82. The thick line of the bit line 72 is structured by a wiring layer, and expresses a wiring for connecting the rectangular-shaped patterns in the column direction of matrix.

The GND line 73 is similarly expressed by a thick line and a rectangular-shaped wiring layer pattern, and has a function for transmitting a power voltage on the low-voltage side to the SRAM cell 85. The rectangular-shaped wiring layer pattern is for connection to the field region 75, and is connected to drains of the NMOS transistors 78 and 81 forming the SRAM cell 85. The thick line of the GND line 73 is a wiring for connecting the rectangular-shaped wiring layer patterns in the column direction of matrix.

The word line 70 comprises a wiring layer, and is connected to the gate electrode 74 of the NMOS transistor 77 forming the SRAM cell 85 and the gate electrode 74 of the NMOS transistor 82. Further, the word line 70 has a function for transmitting a decoding signal for capturing a bit line signal to a storage portion of the SRAM cell 85 through the NMOS transistor 77 and the NMOS transistor 82.

Figure 8:
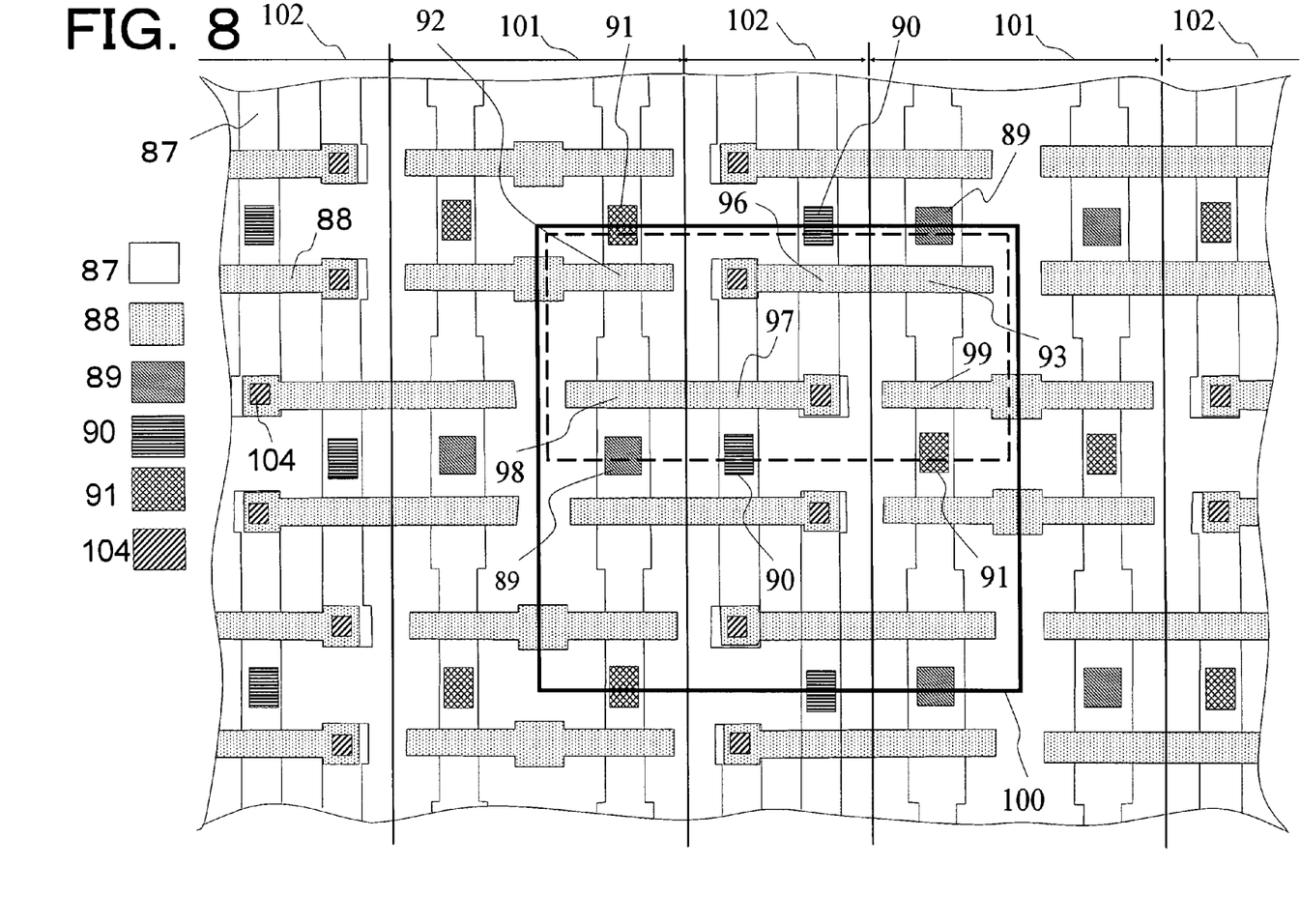
FIG. 8 is a diagram showing the arrangement of a through-hole region of the SRAM cell shown in FIG. 7 according to the third embodiment.

FIG. 8 is a diagram showing the arrangement of the through-hole region in the SRAM cell shown in FIG. 7 in the semiconductor apparatus according to the third embodiment.

Further, FIG. 8 shows a field region 87, a gate electrode 88, a low-voltage power supply 89, a high-voltage power supply 90, a bit line 91, an NMOS transistor 92, an NMOS transistor 93, a PMOS transistor 96, a PMOS transistor 97, an NMOS transistor 98, an NMOS transistor 99, a through-hole region 100, a P-well region 101, and an N-well region 102.

Furthermore, the field region 87 and the gate electrode 88 structure the MOS transistor, similarly to FIG. 6. In addition, the low-voltage power supply 89, the high-voltage power supply 90, the bit line 91, the NMOS transistor 92, the NMOS transistor 93, the PMOS transistor 96, the PMOS transistor 97, the NMOS transistor 98, and the NMOS transistor 99 structure the SRAM cell, similarly to FIG. 7.

Then, the through-hole region 100 is set to include two SRAM cells symmetrical on the top and bottom. The through-hole region 100 includes two SRAM cells because characteristic of the SRAM cells on the top and bottom are provided. Herein, the size of the through-hole region 100 is rectangular with, e.g., 1.0 µm×1.4 µm. Further, the width of the N-well region 101 is approximately 0.5 µm. The width of the P-well-region 102 is approximately 0.7 µm. Furthermore, the border of the through-hole region 100 is arranged between the MOS transistors forming the SRAM cell. In addition, the distance between the border of the through-hole region 100 and the MOS transistor is preferably the distance from the origin shown in FIG. 1C to the position where the N-type-impurity concentration is reduced to predetermined concentration. Incidentally, the distance for reducing the N-type-impurity concentration to predetermined concentration corresponds to the distance for reducing the N-type-impurity to the concentration for preventing the influence to the MOS transistor, e.g., the distance from the origin shown in FIG. 1C to the position where the N-type-impurity concentration is reduced to approximately 2E16/cm$^3$.

With the semiconductor apparatus having the SRAM cell comprising the MOS transistor according to the third embodiment, an NMOS transistor structuring the SRAM cell is arranged to the P-well region, and the PMOS transistor is arranged to the N-well region. The P-well region is arranged in the N-well region, and a region with a deep injection-depth of the N-type-impurity is arranged to the bottom of the P-well region. Further, the through-hole region 100 is arranged to include two SRAM cells, and the border of the through-hole region 100 is arranged between the MOS transistors structuring the SRAM cell. The MOS transistors are arranged so that the distribution of impurity at the border of through-hole region 100 prevents the unstable region, thereby stabilizing the operation of the MOS transistors. As a consequence, the operation of the SRAM cell comprising the MOS transistor is also stable.

Further, the N-well region includes the entire matrix of the SRAM cell, and also shares a region larger than the through-hole region 100. Furthermore, the P-well region shares the area corresponding to one column of the SRAM cell, and also shares a region larger than the through-hole region 100. On the other hand, the through-hole region 100 shares only a part of the P-well region. Therefore, with the triple-well structure according to the third embodiment, it is possible to suppress the injection of current of minority-carrier from the semiconductor substrate to the P-well region, and to feed power to the P-well region from the through-hole region 100. As a consequence, the entire matrix of the SRAM cell is protected from the injection of the current of minority carrier. Further, since the SRAM cell can planarity overlapped to the through-hole region 100, the through-hole region 100 is not necessarily arranged independently, thereby reducing the area of the P-well region.

4. Fourth Embodiment

The fourth embodiment will be described with reference to FIG. 9. Similarly to the third embodiment, according to the fourth embodiment, a semiconductor apparatus has an SRAM cell and, however, the structure of the SRAM cell is different.

Figure 9:
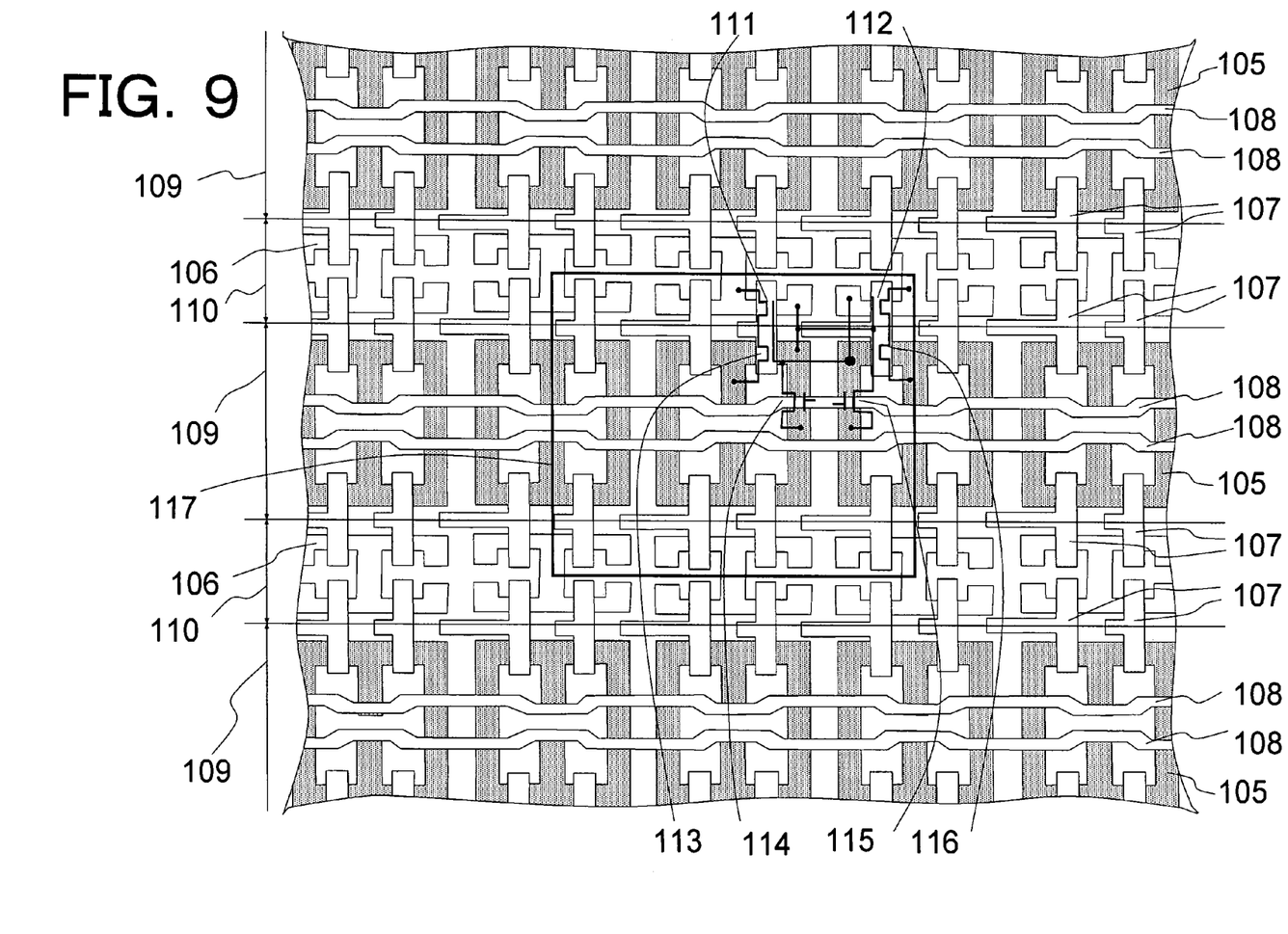
FIG. 9 is a diagram showing a semiconductor apparatus according to the fourth embodiment.

FIG. 9 is a diagram showing the semiconductor apparatus according to the fourth embodiment. Further, FIG. 9 shows field regions 105 and 106, gate electrodes 107 and 108, an N-well region 109, a P-well region 110, PMOS transistors 111 and 112, NMOS transistors 113, 114, 115, and 116, and a through-hole region 117.

The predetermined field region 105 and the gate electrodes 107 and 108 of a predetermined MOS transistor are arranged under a constant rule, thereby arranging the MOS transistors in matrix with constant regularity. Because the MOS transistor is structured at a region where the gate electrodes 107 and 108 are overlapped to the field regions 105 and 106.

The MOS transistors, e.g., the PMOS transistors 111 and 112 and the NMOS transistor 113, 114, 115, and 116 are connected by wiring layers, as shown by the thick line shown in FIG. 8, thereby structuring the SRAM cell. Further, the PMOS transistors 111 and 112 are arranged in the N-well region 109. The NMOS transistors 113, 114, 115, and 116 are arranged in the P-well region 110. Incidentally, the NMOS transistor 113 and the PMOS transistor 111 form an inverter circuit. The NMOS transistor 114 and the PMOS transistor 112 form an inverter circuit. Further, both the inverter circuits are cross-connected. Furthermore, the NMOS transistors 115 and 116 form a transfer gate of the SRAM cell.

The N-well region 109 and the P-well region 110 are planarily rectangular with a long length in the column direction, and are planarity alternately arranged to each other. Therefore, the N-well region 109 is planarity separated into the P-well region 110. However, the region of the P-well region 110 is formed in the N-well region 109, and the N-well region 109 is connected to a region with a deep injection-depth of the N-type-impurity on the bottom of the P-well region 110. That is, the N-well region 109 entirely surrounds the matrix of the SRAM cells. Herein, the width of the N-well region 109 is approximately 0.6 µm. Further, the width of the P-well region 110 is approximately 1.1 µm.

Incidentally, the field region 105 according to the fourth embodiment approximately has the shape obtained by symmetrical arrangement of two regions on the left and right with the opening side of a letter C as the axis. Further, the field region 106 according to the fourth embodiment approximately has the shape obtained by symmetrical arrangement of two regions on the left and right with the opening side of a letter C as the axis. Moreover, the field regions 105 are continuously arranged in the row direction, thereby forming a row of the field regions 105. In addition, the field regions 106 are continuously arranged in the row direction, thereby forming a row of the field regions 106. In addition, the row of the field regions 105 and the row of the field regions 106 are alternately aligned.

The gate electrode 107 includes a stick-shaped pattern with a length crossing both the field region 105 and the field region 106 adjacent to each other. Further, the gate electrodes 107 are arranged in the direction crossing both the field region 105 and the field region 106 adjacent to each other, and are continuously arranged in the row direction.

The N-type impurities are diffused at a portion except for the overlapping portion between the gate electrodes 107 and 108 at the field region 105, thereby structuring sources or drains of the NMOS transistor 113, 114, 115, and 116. The P-type impurities are diffused at a portion except for the overlapping portion with the gate electrode 107 at the field region 106, thereby structuring sources or drains of the PMOS transistors 111 and 112.

The through-hole region 117 is square-shaped including four SRAM cells, and the border of the through-hole region 97 is arranged between the MOS transistors forming the SRAM cell. Herein, the size of the through-hole region 117 is rectangular with 1.7 μm×1.7 μm. Further, the border of the through-hole region 117 is arranged between the MOS transistors forming the SRAM cell. Furthermore, the distance between the border of the through-hole region 117 and the MOS transistor is preferably the distance between the origin shown in FIG. 1C to the position where the N-type-impurity concentration is reduced to predetermined concentration. Incidentally, with respect to the distance to the reduction to predetermined concentration, the N-type-impurity is reduced to the concentration at which the influence is not affected to the MOS transistor, e.g., the distance from the origin shown in FIG. 1C to the point at which the N-type-impurity concentration is reduced to approximately $2E16/cm^3$.

The gate electrodes 108 are continuously connected in the row direction, with a function of a word line of the SRAM cell. Further, a bit line is a wiring comprising a wiring layer. In addition, the bit line is a wiring running on the SRAM cell in parallel with the word line while connecting the field region 105 sandwiched between the gate electrodes 108.

A power line of a low voltage is a wiring comprising a wiring layer. Further, the power line of the low voltage is a wiring running on the SRAM cell in parallel with the bit line and the word line while connecting the field region 106 sandwiched between the gate electrodes 107. A power line of a high voltage is a wiring comprising a wiring layer. Further, the power line of the high voltage is a wiring running on the SRAM cell in parallel with the power line of the low voltage while connecting the field region 106 surrounded between the gate electrodes 107.

With the semiconductor apparatus having the SRAM cell comprising the MOS transistor according to the fourth embodiment, the NMOS transistor forming the SRAM cell is arranged to the P-well region, and the PMOS transistor is arranged to the N-well region. Further, the P-well region is arranged in the N-well region, and a region of a deep injection-depth of the N-type-impurity is arranged to the bottom of the P-well region. Moreover, the through-hole region 117 is arranged, including four SRAM cells, and the border of the through-hole region 117 is arranged between the MOS transistors structuring the SRAM cell. The MOS transistor is arranged to prevent the border of the through-hole region 117, i.e., an unstable region of the impurity distribution, and the operation of the MOS transistor is stable. As a consequence, the operation of the SRAM cell comprising the MOS transistor is also stable.

In addition, the N-well region includes the entire matrix of the SRAM cells, and shares a larger region, as compared with the through-hole region 117. In addition, the P-well region shares the area corresponding to one column of the SRAM cells, serving as a region larger than that of the through-hole region 117. On the other hand, the through-hole region 117 partly shares the P-well region. Therefore, with the triple-well structure according to the fourth embodiment, it is possible to suppress the injection of current of minority carrier from the semiconductor substrate to the P-well region, and to feed power to the P-well region from the through-hole region 117. Accordingly, the entire matrix of the SRAM cells is protected from the injection of current of minority carrier. Further, since the SRAM cell is planarity overlapped to the through-hole region 117, the through-hole region 117 is not necessarily arranged independently, thereby reducing the area of the P-well region.

What is claimed is:

1. A semiconductor apparatus comprising:
   a semiconductor substrate that is entirely a first conductive type;
   a first well-region of a second conductive type that is formed in a surface layer of the semiconductor substrate;
   a second well-region of the first conductive type that is formed in the surface layer of the semiconductor substrate, a bottom surface of the second well-region and a side surface of the second well-region being in contact with the first well-region;
   a transistor that is formed in the second well-region, the transistor being an MOS transistor having a source region and a drain region; and
   a through-hole region that is formed to be pierced through the first well-region, and enables the bottom surface of the second well-region to be electrically conductive to the semiconductor substrate,
   wherein the MOS transistor is arranged above the through-hole region, the MOS transistor being arranged planarily inside of the through-hole region, the border of the through-hole region is arranged to be planarily apart from the MOS transistor, and the source region and the drain region of the MOS transistor is arranged to be apart from the first well-region.

2. The semiconductor apparatus according to claim 1, wherein the first well-region comprises:
   a first impurity-region includes the second-conductive-type impurity that is formed in the surface layer of the semiconductor substrate, the first impurity-region being in contact with the side surface of the second well-region; and
   a second impurity-region having the second-conductive-type impurity formed from the bottom of the second well-region toward the inside of the semiconductor substrate by another step of the first impurity-region.

3. The semiconductor apparatus according to claim 1, wherein the transistor is planarily apart from the border of the through-hole region so that the concentration of impurity that is injected for forming the through-hole region on the surface of the second well-region is reduced under predetermined impurity concentration, as compared with the impurity concentration at the border of the through-hole region.

4. A manufacturing method of a semiconductor apparatus comprising:
   forming a first well-region of a second conductive type in the semiconductor substrate having a first-conductive-type;
   forming a second well-region of the first conductive type in the first well-region in the semiconductor substrate;
   forming a plurality of transistors in the first well-region; and
   forming a through-hole region that enables the bottom surface of the second well-region to be electrically conductive to the semiconductor substrate, the through-hole region being formed to be pierced through the first well-region,
   wherein the border of the through-hole region is arranged between the transistors, and is arranged to be planarily apart from the transistor,
   wherein the transistor is arranged above the through-hole region, the transistor being arranged planarily inside of the through-hole region.

5. A manufacturing method of a semiconductor apparatus comprising:
- forming a first well-region of a second conductive type in the semiconductor substrate having a first-conductive-type;
- forming a second well-region of the first conductive type in the first well-region in the semiconductor substrate;
- forming a plurality of transistors in the second well-region; and
- forming a through-hole region that enables the bottom surface of the second well-region to be electrically conductive to the semiconductor substrate, the through-hole region being formed to be pierced through the first well-region,
- wherein the border of the through-hole region is arranged between the transistors, and is arranged to be planarily apart from the transistor,
- wherein the transistor is arranged above the through-hole region, the transistor being arranged planarily inside of the through-hole region.

* * * * *